US012754357B2

(12) United States Patent
Kang et al.

(10) Patent No.: US 12,754,357 B2
(45) Date of Patent: Oct. 6, 2026

(54) POLARIZING PLATE AND OPTICAL DISPLAY APPARATUS

(71) Applicant: SAMSUNG SDI CO., LTD., Yongin-si (KR)

(72) Inventors: Seo Young Kang, Suwon-si (KR); Il Woong Baek, Suwon-si (KR); Hyeon Im Joung, Suwon-si (KR)

(73) Assignee: HOARDSUN HENGXIN(WUXI) MATERIALS CO., LTD., Wuxi (CN)

( * ) Notice: Subject to any disclaimer, the term of this patent is extended or adjusted under 35 U.S.C. 154(b) by 233 days.

(21) Appl. No.: 18/740,152

(22) Filed: Jun. 11, 2024

(65) Prior Publication Data

US 2024/0411076 A1 Dec. 12, 2024

(30) Foreign Application Priority Data

Jun. 12, 2023 (KR) ........................ 10-2023-0074729

(51) Int. Cl.

| | |
|---|---|
| ***G02B 5/30*** | (2006.01) |
| ***G02B 1/111*** | (2015.01) |
| ***G02B 1/14*** | (2015.01) |
| *H10K 59/80* | (2023.01) |

(52) U.S. Cl.

CPC ............ *G02B 5/3025* (2013.01); *G02B 1/111* (2013.01); *G02B 1/14* (2015.01); *H10K 59/8793* (2023.02)

(58) Field of Classification Search

CPC ........ G02B 5/3025; G02B 1/111; G02B 1/14; G02B 5/3033; G02B 5/3041; G02B 1/11; G02B 5/3083; G02B 5/30; H10K 59/8793; G09F 9/33; G09F 9/335

See application file for complete search history.

(56) References Cited

U.S. PATENT DOCUMENTS

| | | | | |
|---|---|---|---|---|
| 2010/0245714 A1* | 9/2010 | Watanabe | ................ | G02B 5/02 427/164 |
| 2015/0260882 A1* | 9/2015 | Furui | .................. | G02B 5/0221 345/173 |
| 2017/0285236 A1* | 10/2017 | Ryu | ......................... | G02B 1/14 |

FOREIGN PATENT DOCUMENTS

| | | |
|---|---|---|
| JP | 2006251659 A | 9/2006 |
| TW | 202117367 A | 5/2021 |
| TW | 202308852 A | 3/2023 |

OTHER PUBLICATIONS

Taiwanese Office Action dated Dec. 30, 2024, issued in corresponding Taiwanese Patent Application No. 113121518 (4 pages).

* cited by examiner

*Primary Examiner* — Mariam Qureshi

(74) *Attorney, Agent, or Firm* — Ricky Lam

(57) ABSTRACT

A polarizing plate and an optical display apparatus including the same are disclosed. A polarizing plate includes: a polarizer; and a first protective film stacked on a surface of the polarizer, the first protective film has an overall haze of 40% to 60% and an internal haze of 3% to 7%, and the polarizing plate has a light transmittance ratio of 4 or less, as calculated according to Equation 1, and a light transmittance ratio of 20 or more, as calculated according to Equation 2.

11 Claims, 2 Drawing Sheets

POLARIZING PLATE AND OPTICAL DISPLAY APPARATUS

CROSS-REFERENCE TO RELATED APPLICATION

The present application claims priority to and the benefit of Korean Patent Application No. 10-2023-0074729, filed on Jun. 12, 2023 in the Korean Intellectual Property Office, the entire disclosure of which is incorporated herein by reference.

BACKGROUND

1, Field

Aspects of embodiments of the present invention relate to a polarizing plate and an optical display apparatus.

2. Description of the Related Art

Organic light emitting device displays can suffer from deterioration in visibility and contrast due to reflection of external light. To address this problem, a polarizing plate may be used to realize an anti-reflection function by preventing leakage of reflected external light. It is desirable that the organic light emitting device display have a small color difference on a screen thereof between a front side and a lateral side thereof.

Recently, light emitting device displays including organic light emitting devices, particularly TVs, are desired not only to display moving images on a screen, but also to allow a TV screen to act as a picture frame displaying a picture or a photograph through reproduction of the picture or the photograph on the screen. Typically, such a TV is referred to as a frame TV. The frame TV is fundamentally required to allow the picture or the photograph to be clearly viewed. Moreover, the frame TV is desired to reproduce an original texture of a picture or a photograph (also known as "matte texture") such that the picture or the photograph appears to be part of the screen instead of floating above the screen.

The background technique of the present invention is disclosed in Japanese Unexamined Patent Publication No. 2006-251659.

SUMMARY

According to an aspect of embodiments of the present invention, a polarizing plate that can provide matte texture and can reduce color difference on a screen between front and lateral sides when an image is displayed on the screen is provided.

Aspects of one or more embodiments of the present invention relate to a polarizing plate.

According to one or more embodiments, a polarizing plate includes: a polarizer; and a first protective film stacked on a surface of the polarizer, wherein the first protective film has an overall haze of 40% to 60% and an internal haze of 3% to 7%, and the polarizing plate has a light transmittance ratio of 4 or less, as calculated according to the following Equation 1, and a light transmittance ratio of 20 or more, as calculated according to the following Equation 2:

$$\text{Light transmittance ratio}=Tc(430\text{ nm})/Tc(550\text{ nm}), \quad (1)$$

$$\text{Light transmittance ratio}=Tc(700\text{ nm})/Tc(550\text{ nm}), \quad (2)$$

where Tc (430 nm) denotes a crossed transmittance of the polarizing plate at a wavelength of 430 nm (unit: %), Tc (550 nm) denotes a crossed transmittance of the polarizing plate at a wavelength of 550 nm (unit: %), and Tc (700 nm) denotes a crossed transmittance of the polarizing plate at a wavelength of 700 nm (unit: %).

According to another aspect of one or more embodiments of the present invention, an optical display apparatus is provided.

According to one or more embodiments, an optical display apparatus includes the polarizing plate according to an embodiment.

According to an aspect of one or more embodiments of the present invention, a polarizing plate is provided that can provide matte texture and can reduce color difference on a screen between front and lateral sides when an image is displayed on the screen.

DETAILED DESCRIPTION

Figure 1:
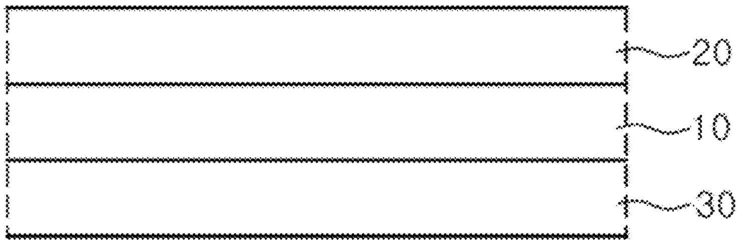
FIG. 1 is a cross-sectional view of a polarizing plate according to an embodiment of the present invention.

Herein, some embodiments of the present invention will be described in further detail with reference to the accompanying drawings such that the present invention can be easily implemented by those skilled in the art. It is to be understood that the present invention may be embodied in different ways and is not limited to the following embodiments.

The terminology used herein is for the purpose of describing some example embodiments and is not intended to limit the present invention. As used herein, the singular forms "a," "an," and "the" are intended to include the plural forms as well, unless the context clearly indicates otherwise.

In the drawings, portions irrelevant to the description may be omitted for clarity, and like components are denoted by like reference numerals throughout the specification. Although lengths, thicknesses, or widths of various components may be exaggerated in the drawings for description of the invention, the present invention is not limited thereto.

Herein, spatially relative terms, such as "upper" and "lower," are defined with reference to the accompanying drawings. Thus, it is to be understood that "upper surface" can be used interchangeably with "lower surface," for example. In addition, when an element, such as a layer or film, is referred to as being placed "on" another element, it may be directly placed on the other element, or one or more intervening elements may be present. On the other hand, when an element is referred to as being placed "directly on" another element, there are no intervening element(s) therebetween.

Herein, "in-plane retardation (Re)" is a value calculated according to the following Equation A:

$$Re=(nx-ny)\times d, \quad (A)$$

where nx and ny are the indexes of refraction of a corresponding optical element, as measured in the slow and fast axis directions thereof at a measurement wavelength, respectively, and d is the thickness thereof (unit: nm). Herein, the in-plane retardation is a value measured by transmitting light in the normal direction to an in-plane direction of the optical element.

Herein, "internal haze" of a first protective film is a value measured in the same manner as in measurement of overall haze of the first protective film after an alcohol, for example, ethanol, is sprayed onto an alkali-free glass plate having an overall haze of less than 1%, followed by adhering an antiglare layer of the first protective film to the alkali-free glass plate in order to flatten unevenness of the antiglare layer surface. "Overall haze" of the first protective film is a value measured by a typical haze meter with respect to the first protective film. "External haze" of the first protective film may be a difference between the overall haze of the first protective film and the internal haze thereof.

Herein, "haze" may be measured in the visible spectrum, for example, at a wavelength of 380 nm to 780 nm.

Herein, "single transmittance (Ts)" of a polarizing plate is a value calculated according to (machine direction (MD) single transmittance of the polarizing plate+transverse direction (TD) single transmittance of the polarizing plate)/2.

Herein, "crossed transmittance (Tc)" of a polarizing plate is calculated according to (MD crossed transmittance of the polarizing plate×TD crossed transmittance of the polarizing plate)/100.

As used herein to represent a specific numerical range, "X to Y" means a value greater than or equal to X and less than or equal to Y.

Polarizing plates according to embodiments of the present invention can provide matte texture of a picture or a photograph on a screen of an optical display apparatus. The polarizing plates can secure clarity of a picture or a photograph while reproducing an original texture ("matte texture") of the picture or the photograph such that the picture or the photograph appears to be part of the screen instead of floating above the screen of the optical display apparatus.

In one or more embodiments, the polarizing plate can reduce a color value difference on the screen between front and lateral sides of the screen when the optical display apparatus is driven to display an image on the screen, thereby preventing or substantially preventing unevenness of screen quality between the front and lateral sides to provide good screen quality.

In one or more embodiments, the polarizing plate may be used as a polarizing plate for prevention or substantial prevention of reflection in a light emitting device display.

In this regard, the polarizing plate according to one or more embodiments of the invention includes: a polarizer; and a first protective film stacked on a surface of the polarizer, wherein the first protective film has an overall haze of 40% to 60% and an internal haze of 3% to 7%, and the polarizing plate has a light transmittance ratio of 4 or less, as calculated according to the following Equation 1, and a light transmittance ratio of 20 or more, as calculated according to the following Equation 2:

$$\text{Light transmittance ratio} = Tc\ (430\ \text{nm})/Tc\ (550\ \text{nm}), \quad (1)$$

$$\text{Light transmittance ratio} = Tc\ (700\ \text{nm})/Tc\ (550\ \text{nm}), \quad (2)$$

where Tc (430 nm) denotes a crossed transmittance of the polarizing plate at a wavelength of 430 nm (unit: %), Tc (550 nm) denotes a crossed transmittance of the polarizing plate at a wavelength of 550 nm (unit: %), and Tc (700 nm) denotes a crossed transmittance of the polarizing plate at a wavelength of 700 nm (unit: %).

In one or more embodiments, the first protective film has an overall haze of 40% to 60% and an internal haze of 3% to 7%. Within this range, the polarizing plate can provide matte texture of a picture or a photograph on the screen of the optical display apparatus. Further, within this range, the polarizing plate can facilitate reduction in color value difference between the front and lateral sides.

In an embodiment, the first protective film may have an overall haze of 40%, 41%, 42%, 43%, 44%, 45%, 46%, 47%, 48%, 49%, 50%, 51%, 52%, 53%, 54%, 55%, 56%, 57%, 58%, 59%, or 60%, for example, 40% to 55%, or, for example, 40% to 50%, or, for example, 43% to 48%. Within this range, the first protective film can secure matte texture and can be easily manufactured.

In an embodiment, the first protective film may have an internal haze of, for example, 3%, 3.5%, 4%, 4.5%, 5%, 5.5%, 6%, 6.5%, or 7%, for example, 3% to 6.5%, or, for example, 3% to 6%, or, for example, 3% to 5%. Within this range, the first protective film can secure matte texture and can be easily manufactured.

In an embodiment, the first protective film may have an external haze of 35% to less than 60%, for example, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, or 59%, for example, 35% to 55%, or, for example, 40% to 50%, or, for example, 40% to 45%. Within this range, the above overall haze and internal haze of the first protective film can be easily achieved.

In an embodiment, the first protective film may have a ratio of external haze to internal haze (external haze/internal haze) of 9 to 20, for example, 9, 9.5, 10, 10.5, 11, 11.5, 12, 12.5, 13, 13.5, 14, 14.5, 15, 15.5, 16, 16.5, 17, 17.5, 18, 18.5, 19, 19.5, or 20, for example, 10 to 15, or, for example, 10 to 13. Within this range, the above overall haze and internal haze of the first protective film can be easily achieved.

The first protective film may be stacked on a light incidence surface of the polarizer.

The first protective film may include a base layer and an antiglare layer stacked on a surface of the base layer.

The base layer may support the antiglare layer.

In an embodiment, each of internal haze, external haze and overall haze of the base layer may be 1% or less, for example, 0% to 0.5%. Within this range, the base layer does not affect the overall haze and internal haze of the first protective film.

The base layer may include an optically transparent base film, for example, a base film having a light transmittance of 90% or more in the visible spectrum. The base layer may further include a coating layer formed on at least one surface of the base film.

In an embodiment, the base layer may be composed of the base film alone. The base film may be a film including an optically transparent resin. For example, the base film may be a film formed of at least one resin selected from among cellulosic resins including triacetylcellulose (TAC) and the like, polyester resins including polyethylene terephthalate (PET), polybutylene terephthalate, polyethylene naphthalate, polybutylene naphthalate, and the like, acrylic resins, cyclic olefin polymer (COP) resins, cyclic olefin copolymer (COC) resins, polycarbonate resins, polyether sulfone resins, polysulfone resins, polyamide resins, polyimide resins, polyolefin resins, polyarylate resins, polyvinyl alcohol resins, polyvinyl chloride resins, and polyvinylidene chloride resins. In an embodiment, the base film is a polyethylene terephthalate or acrylic film.

In an embodiment, the base film, for example, the base layer, may have an in-plane retardation of 5,000 nm or more, and, in an embodiment, 5,000 nm to 15,000 nm, and, in an embodiment, 5,000 nm to 12,000 nm, at a wavelength of 550 nm. Within this range, the base film can suppress rainbow mura and the like.

In another embodiment, the base film, and, in an embodiment, the base layer, may have an in-plane retardation of less than 5,000 nm, for example, 0 to 1,000 nm, for example, 0 to 50 nm, at a wavelength of 550 nm.

The base film may be uniaxially or biaxially stretched to provide the in-plane retardation mentioned above. In an embodiment, the base film may be prepared by preparing a non-stretched film from a composition for base films including the resin and stretching the non-stretched film uniaxially in the machine direction (MD), uniaxially in the transverse direction (TD), or biaxially in the MD and the TD. The stretching ratio may be suitably selected in consideration of the thickness of the non-stretched film, target in-plane retardation, stretching temperature, and the like. For example, the stretching ratio may be set to 2 to 7 times, or 3 to 8 times, an initial length of the non-stretched film. The stretching temperature may be adjusted according to a glass transition temperature (Tg) of the non-stretched film. For example, the stretching temperature may be Tg±20° C. Stretching may be performed by a typical method known to those skilled in the art.

In an embodiment, the base film may be composed of a base layer alone, which has the above in-plane retardation at a wavelength of 550 nm.

In another embodiment, the base layer may further include a primer layer as a coating layer in addition to the base layer having the aforementioned in-plane retardation at a wavelength 550 nm. The primer layer can improve adhesion to an adherend or the antiglare layer. The primer layer may be formed of a composition including a resin for the primer layer, for example, a urethane resin, an acrylic resin, a polyester resin, and the like so as not to affect an effect of the first protective film.

In an embodiment, the base layer may have a thickness of 50 μm to 100 μm, for example, 60 μm to 90 μm. Within this range, the base layer can act as a support for the first protective film.

The antiglare layer provides the overall haze and internal haze of the first protective film.

The antiglare layer is directly formed on the base layer. Here, "directly formed" means that the base layer and the antiglare layer are directly stacked without any adhesive layer, bonding layer, adhesive/bonding layer or any other optical layer therebetween. The antiglare layer may be formed by directly coating a composition for the antiglare layer on the base layer.

For the antiglare layer, the surface of the antiglare layer and/or the composition for the antiglare layer may be adjusted so as to achieve the overall haze and internal haze of the first protective film.

In an embodiment, fine roughness may be formed on a surface of the antiglare layer, for example, a surface of the antiglare layer opposite the base layer.

The fine roughness may be formed on the antiglare layer including inorganic particles and/or organic particles. With the fine roughness, the antiglare layer can have overall haze and internal haze within suitable ranges.

Now, the organic particles included in the antiglare layer will be described. The organic particles may be contained in the composition for the antiglare layer and may have a different index of refraction than a matrix for the antiglare layer to allow adjustment in haze of the first protective film and improvement in effects of the present invention by providing a certain range (e.g., a predetermined range) of surface roughness Sa to the antiglare layer.

In an embodiment, in the antiglare layer, the organic particles may be present in an amount of 5% by weight (wt %) to 50 wt %, for example, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt %, or 50 wt %, for example, 10 wt % to 40 wt %, or, for example, 10 wt % to 20 wt %. Within this range, the organic particles can provide an antiglare effect.

The organic particles may be any of microparticles, nanoparticles, and the like, and may have any suitable shape, such as a spherical shape, an amorphous shape, and the like, without being limited thereto. In an embodiment, the organic particles may have an average particle diameter (D50) of 0.01 μm to 6 μm. Within this range, the organic particles can provide the antiglare effect. The organic particles are contained in a composition including a resin for the antiglare layer and may have an average particle diameter (D50) of 0.5 μm to 5.5 μm, for example, 1 μm to 5 μm, for formation of the antiglare layer.

As used herein, "average particle diameter (D50)" means a typical average particle size (D50) known to those skilled in the art and means a particle diameter of the organic particles corresponding to 50 vol % when the organic particles are distributed in order from smallest to largest in terms of volume.

In an embodiment, the organic particles have a higher index of refraction than the matrix for the antiglare layer and may have an index of refraction of 1.30 to 1.70, for example, 1.40 to 1.60. Within this range, the organic particles can easily form the antiglare layer according to the present invention.

The organic particles may be suitably selected from organic particles having the index of refraction mentioned above.

For example, although the organic particles may include core-shell type organic particles, the organic particles, in an embodiment, are non-core-shell type particles, that is, organic particles composed of a single material. The single material for the organic particles may be any of polyacrylate based particles, poly(methyl methacrylate) (PMMA) based particles, polystyrene (PS) based particles, silicone based particles, polycarbonate based particles, polyolefin based particles, polyester based particles, polyamide based particles, polyimide based particles, polyfluoroethylene based particles, poly(methyl methacrylate)-polyacrylate based particles, polyacrylate-polystyrene based particles, melamine based particles, and the like. In an embodiment, the organic particles are a mixture of polystyrene based particles and polyacrylate based or polymethacrylate based particles.

The antiglare layer may include the organic particles and a matrix for the antiglare layer in which the organic particles are dispersed, and the matrix for the antiglare layer may have a lower index of refraction than the organic particles. The antiglare layer may be formed of a composition including the organic particles and an actinic radiation-curable compound. The actinic radiation-curable compound may include an actinic radiation-curable resin or oligomer and an actinic radiation-curable monomer. The actinic radiation-curable resin or oligomer may be selected from any suitable type known to those skilled in the art.

The composition may further include at least one photoinitiator selected from among a photo-radical initiator and a photo-cationic initiator. The photoinitiator can cure an actinic radiation-curable resin and an actinic radiation-curable monomer. The photo-radical initiator may include a photo-radical initiator, such as an acetophenone based initiator, a cyclohexylketone based initiator, and the like.

In an embodiment, the composition may include 5 wt % to 50 wt %, for example, 10 wt % to 40 wt %, or, for example, 10 wt % to 20 wt %, of the organic particles, 20 wt % to 80 wt %, for example, 50 wt % to 70 wt %, of the actinic radiation-curable resin or oligomer, 10 wt % to 80 wt %, for example, 10 wt % to 30 wt %, of the actinic radiation-curable monomer, and 1 wt % to 10 wt % of the photoinitiator in terms of solid content.

The composition for the antiglare layer may include any suitable solvent in an amount not dissolving the organic particles. The solvent may be any of methyl ethyl ketone, propylene glycol methyl ether, and the like, without being limited thereto.

The composition for the antiglare layer may further include typical additives that can be included in the antiglare layer. The antiglare layer may be formed by depositing the composition for the antiglare layer on a surface of the base layer, followed by drying and curing. Curing may be performed by a typical method known to those skilled in the art, such as any of heat curing, photocuring, and the like.

In an embodiment, the antiglare layer may have a thickness of 2 μm to 10 μm, for example, 3 μm to 7 μm. Within this range, the antiglare layer can be included in the first protective film.

The first protective film may further include an antireflection layer stacked on a surface of the antiglare layer.

The antireflection layer can effectively realize the effects of the invention by reducing reflectivity of the polarizing plate having the first protective film.

In an embodiment, the antireflection layer may be directly formed on the antiglare layer. Here, "directly formed" means that the antireflection layer is disposed on the antiglare layer without any adhesive layer, bonding layer, adhesive/bonding layer or any other optical layer therebetween. In an embodiment, the antireflection layer may be formed by directly coating a composition for the antireflection layer on the antiglare layer.

In an embodiment, the antireflection layer may have an index of refraction of 2.0 or less, for example, 1.2 to 1.4. Within this range, the antireflection layer can easily provide an anti-reflection effect. The antireflection layer can provide reflectivity of the film by adjusting the composition for the antireflection layer.

The composition for the antireflection layer may include at least one selected from among inorganic particles and a fluorine compound. The inorganic particles and the fluorine compound can reduce the index of refraction of the antireflection layer.

In an embodiment, the inorganic particles may have a hollow shape to provide a low index of refraction. For example, the inorganic particles may be inorganic particles having a low index of refraction and, in an embodiment, hollow silica. In an embodiment, the inorganic particles may have an index of refraction of less than 1.5, for example, 1.0 to less than 1.5. Within this range, the inorganic particles can easily reduce the index of refraction of the antireflection layer.

The inorganic particles have a smaller average particle diameter (D50) than the thickness of the antireflection layer, whereby the surface roughness Sa of the antireflection layer can be easily achieved. In an embodiment, the inorganic particles may have an average particle diameter (D50) of 50 nm to 150 nm, for example, 50 nm to 120 nm.

In an embodiment, in the antireflection layer, the inorganic particles may be present in an amount of 30 wt % to 70 wt %, for example, 40 wt % to 60 wt %, or, for example, 50 wt % to 60 wt %. Within this range, the antireflection layer can easily reach the reflectivity of the present invention.

The fluorine based compound can make it easy to reduce the index of refraction of the antireflection layer even with a small amount of the inorganic particles.

The fluorine based compound may include a fluorine-containing (meth)acrylate monomer, an oligomer thereof, or a resin thereof.

The composition for the antireflection layer may further include at least one selected from among an actinic radiation-curable resin or oligomer and an actinic radiation-curable monomer, and a photoinitiator in addition to the inorganic particles and the fluorine based compound. The actinic radiation-curable resin and the actinic radiation-curable monomer may be cured to make it easy to form the matrix of the antireflection layer and to allow particles having a low index of refraction to be stably contained in the antireflection layer. The actinic radiation-curable resin, the actinic radiation-curable monomer, and the photoinitiator may be the same as those described above in the antiglare layer.

In an embodiment, the composition for the antireflection layer may include 20 wt % to 80 wt % of at least one selected from among the actinic radiation-curable resin, the actinic radiation-curable oligomer and the actinic radiation-curable monomer, 30 wt % to 70 wt %, and, in an embodiment, 50 wt % to 70 wt %, of the inorganic particles, 1 wt % to 10 wt % of the fluorine compound, and 1 wt % to 10 wt % of the photoinitiator in terms of solid content. Within this range, the composition can easily form the antireflection layer according to the present invention.

The composition for the antireflection layer may further include typical additives that can be contained in the antireflection layer. For example, the additives may impart an antifouling function and slimness to the antireflection layer, and may include typical additives known to those skilled in the art. The additives may include at least one selected from among fluorine-containing additives and silicone-based additives. The antireflection layer may be formed by depositing the composition for the antireflection layer on a surface of the base layer, followed by drying and curing. Curing may be performed by a typical method known to those skilled in the art, such as any of heat curing, photocuring, and the like.

In an embodiment, the antireflection layer may have a thickness of 60 nm to 200 nm, and, in an embodiment, 80 nm to 150 nm. Within this range, the antireflection layer can be included in the first protective film.

The first protective film may be stacked on the polarizer in a typical manner. For example, the first protective film may be stacked on the polarizer by a bonding layer formed of a water-based or photocurable bonding agent.

With the first protective film having the overall haze and the internal haze mentioned above, the polarizing plate can provide matte texture of a picture or a photograph on a screen of an optical display apparatus. By further satisfying the light transmittance ratios of Equations 1 and 2, the polarizing plate can reduce a color value difference between the front and lateral sides when the optical display apparatus is operated to display an image on the screen, thereby securing excellent screen quality without non-uniform screen quality between the front and lateral sides.

In an embodiment, the polarizing plate has a light transmittance ratio of 4 or less, as calculated according to the following Equation 1, and a light transmittance ratio of 20 or more, as calculated according to the following Equation 2:

$$\text{Light transmittance ratio} = Tc\ (430\ \text{nm})/Tc\ (550\ \text{nm}), \quad (1)$$

$$\text{Light transmittance ratio} = Tc\ (700\ \text{nm})/Tc\ (550\ \text{nm}), \quad (2)$$

where Tc (430 nm) denotes a crossed transmittance of the polarizing plate at a wavelength of 430 nm (unit: %), Tc (550 nm) denotes a crossed transmittance of the polarizing plate at a wavelength of 550 nm (unit: %), and Tc (700 nm) denotes a crossed transmittance of the polarizing plate at a wavelength of 700 nm (unit: %).

Within the above range, the polarizing plate including the first protective film having the overall haze and the internal haze mentioned above can easily reduce a color value difference on the screen between the front and lateral sides.

In an embodiment, the polarizing plate has a light transmittance ratio of 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, or 4.0, for example, 1.5 to 4.0, or, for example, 2.0 to 4.0, as calculated according to Equation 1. Within this range, the polarizing plate can be easily manufactured with the aforementioned effects and does not affect the matte texture.

In an embodiment, the polarizing plate may have a light transmittance ratio of 20.0, 21, 22, 23, 24, 25, 26, 27, 28, 29, 30, 31, 32, 33, 34, 35, 36, 37, 38, 39, or 40, for example, 20.0 to 30.0, as calculated according to Equation 2. Within this range, the polarizing plate can be easily manufactured with the aforementioned effects and does not affect the matte texture.

The crossed transmittances of the polarizing plate at wavelengths of 430 nm, 550 nm, and 700 nm are selected to secure excellent screen quality without non-uniform screen quality between the front and lateral sides through reduction in color value difference between the front and lateral sides in the polarizing plate including the protective film having the above haze values.

In an embodiment, the polarizing plate may have a crossed transmittance at a wavelength of 430 nm of 0.009% or less, for example, 0.001%, 0.002%, 0.003%, 0.004%, 0.005%, 0.006%, 0.007%, 0.008%, or 0.009%, for example, 0.001% to 0.009%, or, for example, 0.002% to 0.0085%. Within this range, the polarizing plate can easily achieve the light transmittance ratio of Equation 1.

In an embodiment, the polarizing plate may have a crossed transmittance at a wavelength of 550 nm of 0.005% or less, for example, 0.0001%, 0.0005%, 0.001%, 0.002%, 0.003%, 0.004%, or 0.005%, or, for example, 0.0001% to 0.005%, or, for example, 0.001% to 0.005%. Within this range, the polarizing plate can easily achieve the light transmittance ratios of Equations 1 and 2.

In an embodiment, the polarizing plate may have a crossed transmittance at a wavelength of 700 nm of 0.035% or more, for example, 0.035%, 0.040%, 0.045%, 0.050%, 0.055%, 0.060%, 0.065%, 0.070%, 0.075%, 0.080%, 0.085%, or 0.090%, or, for example, 0.035% to 0.090%, or, for example, 0.040% to 0.070%. Within this range, the polarizing plate can easily achieve the light transmittance ratio of Equation 2.

For the polarizing plate, the ratio of 4 or less as calculated according to Equation 1 and the ratio of 20 or more as calculated according to Equation 2 may be realized by a polyvinyl alcohol film and a polarizer manufactured by a manufacturing process described below, without being particularly limited thereto. In an embodiment, the polarizing plate includes the polarizer and the first protective film described above, thereby realizing the ratio of 4 or less according to Equation 1 and the ratio of 20 or more according to Equation 2.

The polarizer includes a light absorbing polarizer that divides incident light into two crossed polarization components and transmits one polarization component while absorbing the other polarization component.

The polarizer may include a uniaxially stretched polarizer containing a dichroic dye. In an embodiment, the polarizer containing a dichroic dye may include a polarizer manufactured by uniaxially stretching a base film for the polarizer in the MD and dyeing the stretched base film with the dichroic dye (for example, iodine or an iodine-containing substance including potassium iodide). The base film for the polarizer may include a polyvinyl alcohol based film or a derivative thereof, without being limited thereto.

In an embodiment, the polarizer may have a thickness of 1 μm to 40 μm, for example, 15 μm to 30 μm, or, for example, 17 μm to 20 μm. Within this range, the polarizer can be used in the polarizing plate.

The polyvinyl alcohol based film may contain a hydrophilic functional group and a hydrophobic functional group. The hydrophobic functional group is present in addition to a hydroxyl (OH) group present as the hydrophilic functional group in the polyvinyl alcohol film. By preparing the polyvinyl alcohol film containing both the hydrophilic functional group and the hydrophobic functional group through a process described below, the polarizing plate according to the present invention can easily realize the effects of the present invention.

The hydrophobic functional group is present in a main chain and/or a side chain of a polyvinyl alcohol resin constituting the polyvinyl alcohol film. The "main chain" means a portion constituting the main backbone of the polyvinyl alcohol resin, and the "side chain" means a backbone connected to the main chain. In an embodiment, the hydrophobic functional group is present in the main chain of the polyvinyl alcohol resin.

In an embodiment, the polyvinyl alcohol resin containing the hydrophilic functional group and the hydrophobic functional group may be prepared by polymerizing at least one vinyl ester monomer, such as vinyl acetate, vinyl formate, vinyl propionate, vinyl butyrate, vinyl pivalate, and isopropenyl acetate, with a monomer providing a hydrophobic functional group. In an embodiment, the vinyl ester monomer includes vinyl acetate. The monomer providing the hydrophobic functional group may include a monomer providing a hydrocarbon repeat unit including ethylene, propylene, or the like.

In an embodiment, the polyvinyl alcohol film may have a thickness of 50 μm or less, for example, 10 μm to 50 μm. Within this range, the polyvinyl alcohol film does not suffer from melting and fracture when stretched.

The polarizer may be manufactured by subjecting the polyvinyl alcohol film to dyeing, stretching, crosslinking, color correction and drying processes, as described below. The sequence of the dyeing, stretching, and crosslinking processes may be changed depending on the kind of polyvinyl alcohol film and a polarizer manufacturing process.

The dyeing process includes treatment of the polyvinyl alcohol film in a dyeing bath containing a dichroic substance. In the dyeing process, the polyvinyl alcohol film is dipped in the dyeing bath containing the dichroic substance. The dyeing bath containing the dichroic substance includes an aqueous solution containing the dichroic substance and boric acid. As the dyeing bath contains both the dichroic substance and a boron compound, the polyvinyl alcohol film can be prevented or substantially prevented from fracture even when dyed and stretched under the following stretching conditions.

The dichroic substance is an iodine-containing substance and may include at least one selected from among iodine ($I_2$), potassium iodide, hydrogen iodide, lithium iodide, sodium iodide, zinc iodide, aluminum iodide, lead iodide, and copper iodide. In an embodiment, the dichroic substance may be present in an amount of 0.5 mol/ml to 10 mol/ml, and, in an embodiment, 0.5 mol/ml to 5 mol/ml, in the dyeing bath, for example, in a dyeing aqueous solution. Within this range, uniform deposition can be achieved.

The boron compound can assist in prevention of melting and fracture of the polyvinyl alcohol film upon stretching of the polyvinyl alcohol film. The boron compound can assist in prevention of melting and fracture of the polyvinyl alcohol film in the stretching process after the dyeing process, even when the polyvinyl alcohol film is stretched at high temperature and high stretching ratio.

The boron compound may include at least one selected from among boric acid and borax. In an embodiment, the boron compound may be present in an amount of 0.1 wt % to 5 wt %, and, in an embodiment, 0.3 wt % to 3 wt %, in the dyeing bath, and, in an embodiment, in the dyeing aqueous solution. Within this range, the polyvinyl alcohol film does not suffer from melting and fracture in the stretching process and can achieve high reliability.

In an embodiment, the dyeing solution may have a temperature of 20° C. to 50° C., and, in an embodiment, 25° C. to 40° C. In an embodiment, in the dyeing process, the polyvinyl alcohol film may be dipped in the dyeing bath for 30 seconds to 120 seconds, and, in an embodiment, 40 seconds to 80 seconds. Within these ranges, the polarizer of the polarizing plate according to the present invention can be easily manufactured.

The stretching process includes stretching the dyed polyvinyl alcohol film at a stretching ratio of 5.7 times or more, for example, 5.7 times to 7 times, at a temperature of 57° C. or more, for example, at 57° C. to 65° C.

The stretching process may be performed by either wet stretching or dry stretching. In an embodiment, the stretching process includes wet stretching in order to apply the boron compound during the stretching process. Wet stretching includes uniaxial stretching of the polyvinyl alcohol film in the machine direction (MD) in an aqueous solution containing a boron compound.

The boron compound may include at least one selected from among boric acid and borax. In an embodiment, the boron compound may be present in an amount of 0.1 wt % to 5 wt %, and, in an embodiment, 0.3 wt % to 5 wt %, in a stretching bath, and, in an embodiment, in a stretching aqueous solution. Within this range, the polyvinyl alcohol film does not suffer from melting and fracture in the stretching process and can achieve high reliability.

In an embodiment, the stretching solution has a temperature of 57° C. or more, for example, 57° C. to 65° C.

The crosslinking process is performed to enhance adsorption of the dichroic material to the stretched polyvinyl alcohol film. A crosslinking solution used in the crosslinking process may include a boron compound. The boron compound can assist in strong adsorption of the dichroic material described above while improving reliability of the polarizer even when the polarizer is left under a thermal shock condition.

The boron compound may include at least one selected from among boric acid and borax. In an embodiment, the boron compound may be present in an amount of 0.5 wt % to 10 wt %, and, in an embodiment, 1 wt % to 5 wt %, in a crosslinking bath, and, in an embodiment, in a crosslinking aqueous solution. Within this range, the polyvinyl alcohol film does not suffer from melting and fracture in the stretching process and can achieve high reliability.

The crosslinking bath may have a temperature of 20° C. to 50° C., and, in an embodiment, 25° C. to 40° C. The crosslinking process may be performed by dipping the polyvinyl alcohol film in the crosslinking bath for 30 seconds to 120 seconds, and, in an embodiment, for 40 sec to 80 sec.

In the crosslinking process, the polyvinyl alcohol film is further uniaxially stretched in the MD. Additional stretching can facilitate the polarizing plate to reach the ratios of Equations 1 and 2.

The color correction process can improve durability of the polarizer. A color correction bath may include a color correction solution containing greater than 0 wt % to 10 wt %, and, in an embodiment, 1 wt % to 5 wt %, of potassium iodide. The color correction solution may have a temperature of 20° C. to 50° C., and, in an embodiment, 25° C. to 40° C. The color correction process may be performed by dipping the polyvinyl alcohol film in the color correction bath for 5 to 50 seconds, and, in an embodiment 5 to 20 seconds.

In the color correction process, the polyvinyl alcohol film is further uniaxially stretched in the MD. Additional stretching can facilitate the polarizing plate to reach the ratios of Equations 1 and 2.

The drying process may be performed by drying the polyvinyl alcohol film at 60° C. to 90° C., and, in an embodiment, at 70° C. to 90° C., for 30 seconds to 10 minutes, and, in an embodiment, for 30 seconds to 5 minutes. The drying process may be performed by hot air drying, but is not limited thereto.

The light transmittance ratios of Equations 1 and 2 above may be realized by adjusting not only the MD uniaxial stretching ratio in the wet stretching bath but also the MD uniaxial stretching ratios in the crosslinking bath and the color correction bath in the polarizer manufacturing process. Each or all of the MD uniaxial stretching ratios in the crosslinking bath and the color correction bath may be adjusted to be lower than and up to three times the MD uniaxial stretching ratio in the wet stretching bath.

The polyvinyl alcohol film may be subjected to a washing process and/or a swelling process before the dyeing process.

In the washing process, the polyvinyl alcohol film is washed with water to remove foreign matter from the polyvinyl alcohol film.

In the swelling process, the polyvinyl alcohol film is dipped in a swelling bath in a certain temperature range (e.g., a predetermined temperature range) to facilitate dyeing with the dichroic material and stretching. In an embodiment, the swelling process may be performed at 15° C. to 35° C., and, in an embodiment, at 20° C. to 30° C., for 30 seconds to 50 seconds.

In an embodiment, the polarizer may have a polarization degree of 95% or more, and, in an embodiment, 95% to 100%, and, in an embodiment, 98% to 100%. Within this range, the polarizing plate can easily realize the effects of the present invention.

The polarizing plate may further include a second protective layer stacked on another surface of the polarizer (light exit surface of the polarizer).

The second protective layer may be a retardation film that can provide an anti-reflection effect. For example, the second protective layer may have an in-plane retardation of 100 nm to 150 nm at a wavelength of 550 nm.

The second protective layer may include a liquid crystal layer and/or a non-liquid crystal layer. The second protective layer may be a single coating layer or film or multiple coating layers or films.

In an embodiment, the second protective layer may be composed of a single liquid crystal layer or multiple liquid crystal layers. The liquid crystal layer may be formed of a typical composition for liquid crystal layers known to those skilled in the art.

In another embodiment, the second protective layer may be a non-liquid crystalline retardation film.

For example, the second protective layer may be a stretched film formed of at least one resin selected from among cellulose resins including triacetylcellulose (TAC) and the like, polyester resins including polyethylene terephthalate, polybutylene terephthalate, polyethylene naphthalate (PEN), polybutylene naphthalate, and the like, cyclic polyolefin resins, polycarbonate resins, polyether sulfone resins, polysulfone resins, polyamide resins, polyimide resins, polyolefin resins, polyarylate resins, polyvinyl alcohol resins, polyvinyl chloride resins, and polyvinylidene chloride resins.

In another example, the second protective layer includes a first retardation layer and a second retardation layer stacked on a surface of the first retardation layer, wherein the first retardation layer is a non-liquid crystalline retardation film and the second retardation layer is a non-liquid crystalline coating layer. The second retardation layer may be directly formed on the first retardation layer or may be stacked thereon via an adhesive layer or a bonding layer.

In an embodiment, the first retardation layer exhibits positive dispersion and may have an in-plane retardation of 180 nm to 250 nm at a wavelength of 550 nm. Within this range, the first retardation layer can be combined with the second retardation layer to provide an anti-reflection effect.

The non-liquid crystalline retardation film may be a film formed of at least one resin selected from among cellulose resins including triacetylcellulose (TAC) and the like, polyester resins including polyethylene terephthalate, polybutylene terephthalate, polyethylene naphthalate (PEN), polybutylene naphthalate, and the like, cyclic olefin polymer (COP) resins, cyclic olefin copolymer (COC) resins, polycarbonate resins, polyether sulfone resins, polysulfone resins, polyamide resins, polyimide resins, polyolefin resins, polyarylate resins, polyvinyl alcohol resins, polyvinyl chloride resins, and polyvinylidene chloride resins. In an embodiment, the non-liquid crystalline retardation film is a cyclic olefin polymer (COP) or cyclic olefin copolymer (COC) film.

In an embodiment, the second retardation layer exhibits positive dispersion and may have an in-plane retardation of 100 nm to 160 nm at a wavelength of 550 nm. Within this range, the second retardation layer can be combined with the first retardation layer to provide an anti-reflection effect.

The non-liquid crystalline coating layer may be formed of a composition for retardation layers including a resin having a negative intrinsic birefringence.

The resin having a negative intrinsic birefringence includes a polymer having a negative intrinsic birefringence. The polymer having a negative intrinsic birefringence may include, for example, at least one selected from among a homopolymer of styrene or a styrene derivative, a polystyrene polymer including a copolymer of styrene or a styrene derivative and a comonomer, a polyacrylonitrile polymer, a poly(methyl methacrylate) copolymer, and a cellulose copolymer including a cellulose ester, without being limited thereto. The comonomer may include at least one selected from among acrylonitrile, maleic anhydride, methyl methacrylate, and butadiene. In an embodiment, the second retardation layer may include at least one selected from among polystyrene and cellulose compounds.

In an embodiment, the cellulose compound may include a cellulose ester polymer including at least a unit, in which at least some hydrogen atoms of hydroxyl groups [a $C_2$ hydroxyl group, a $C_3$ hydroxyl group or a $C_6$ hydroxyl group] of a sugar monomer constituting the cellulose are substituted with an acyl group, as represented by the following Formula 1. Here, the acyl group may be substituted or unsubstituted. Formula 1

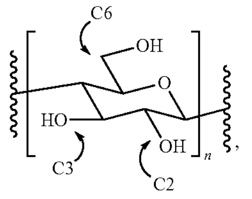

where n is an integer of 1 or more.

In an embodiment, the polystyrene system may include repeat units of the following Formula 2:

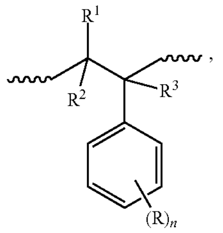

where  is a linking site; $R^1$, $R^2$, and $R^3$ are each independently a hydrogen atom, an alkyl group, a substituted alkyl group, or a halogen; Rs are each independently an alkyl, substituted alkyl, halogen, hydroxyl, carboxyl, nitro, alkoxy, amino, sulfonate, phosphate, acyl, acyloxy, phenyl, alkoxy carbonyl, or cyano group, at least one of $R^1$, $R^2$, and $R^3$ being a halogen and/or at least one R being a halogen; and n is an integer of 0 to 5.

In an embodiment, the halogen means fluorine (F), Cl, Br, or I, and, in an embodiment, F.

FIG. 1 is a cross-sectional view of a polarizing plate according to an embodiment of the present invention. Referring to FIG. 1, the polarizing plate may include a polarizer 10, a first protective film, or layer, 20 stacked on an upper surface of the polarizer 10, and a second protective film, or layer, 30 stacked on a lower surface of the polarizer 10. Although not shown in FIG. 1, an adhesive layer or a bonding layer may be interposed between the polarizer 10 and the first protective film 20, between the polarizer 10 and the second protective film 30, and/or on a lower surface of the second protective film 30.

Figure 3:
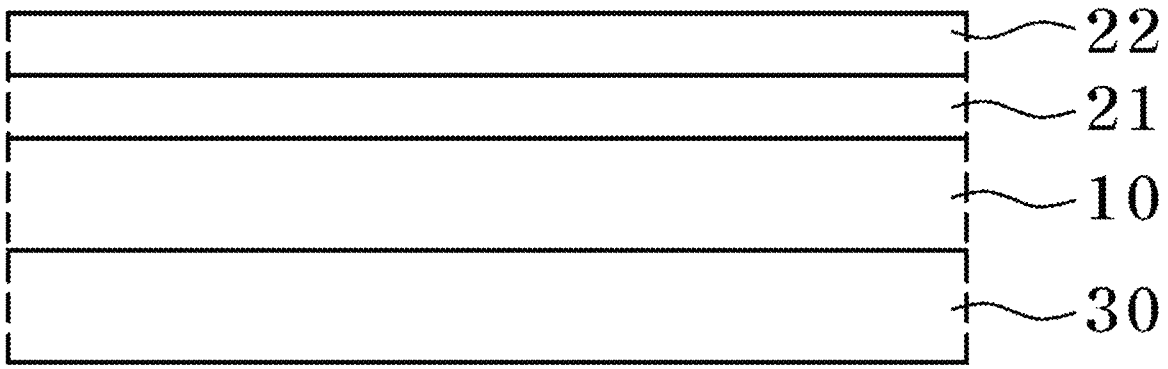
FIG. 3 is a cross-sectional view of a polarizing plate according to another embodiment of the present invention.

FIG. 3 is a cross-sectional view of a polarizing plate according to another embodiment of the present invention. Referring to FIG. 3, the polarizing plate may include a polarizer 10, a base layer 21 and an antiglare layer 22, orderly stacked on an upper surface of the polarizer 10, and a second protective film, or layer, 30 stacked on a lower surface of the polarizer 10. Although not shown in FIG. 3, an adhesive layer or a bonding layer may be interposed between the polarizer 10 and the base layer 21, between the polarizer 10 and the second protective film 30, and/or on a lower surface of the second protective film 30.

Figure 4:
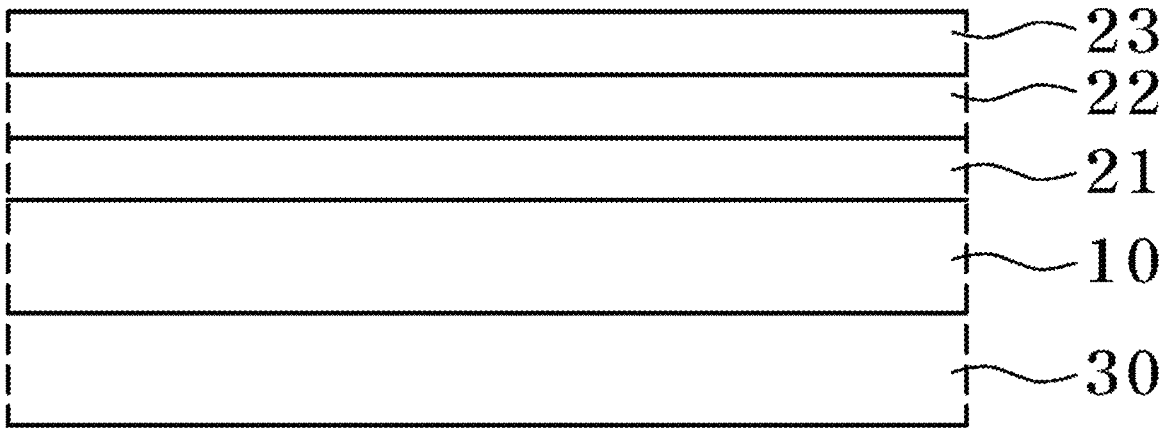
FIG. 4 is a cross-sectional view of a polarizing plate according to another embodiment of the present invention.

FIG. 4 is a cross-sectional view of a polarizing plate according to another embodiment of the present invention. Referring to FIG. 4, the polarizing plate may include a polarizer 10, a base layer 21, an antiglare layer 22 and an antireflection layer 23, orderly stacked on an upper surface of the polarizer 10, and a second protective film, or layer, 30 stacked on a lower surface of the polarizer 10. Although not shown in FIG. 4, an adhesive layer or a bonding layer may be interposed between the polarizer 10 and the base layer 21, between the polarizer 10 and the second protective film 30, and/or on a lower surface of the second protective film 30.

In an embodiment, the polarizing plate may have a ratio of 0.25 or less, for example, 0.08, 0.09, 0.10, 0.11, 0.12, 0.13, 0.14, 0.15, 0.16, 0.17, 0.18, 0.19, 0.20, 0.21, 0.22, 0.23, 0.24, or 0.25, or, for example, 0.08 to 0.25, or, for example, 0.1 to 0.2, or, for example, 0.1 to 0.15, as calculated according to the following Equation 3:

$$\text{Ratio} = Tc\ (700\ \text{nm})/(\text{Haze} \times 0.01), \tag{3}$$

where Haze denotes overall haze of the first protective film (unit: %), and Tc (700 nm) denotes a crossed transmittance of the polarizing plate at a wavelength of 700 nm (unit: %).

Within this range, the polarizing plate can achieve further improvement in effectiveness of the present invention.

Equation 3 may be a criterion for determining whether the polarizing plate provides matte texture of a picture or a photograph on a screen of an optical display apparatus and reduces a color value difference on the screen between the front and lateral sides of the optical display apparatus. Equation 3 may be realized by adjusting the crossed transmittance of the polarizing plate and the overall haze of the first protective film at a wavelength of 770 nm.

In an embodiment, an optical display apparatus includes the polarizing plate according to an embodiment of the present invention. In an embodiment, the optical display apparatus may include a light emitting device display including any of inorganic light emitting devices, organic light emitting devices, organic/inorganic light emitting devices, and the like.

Next, the present invention will be described in further detail with reference to some examples. However, it is to be understood that these examples are provided for illustration and are not to be construed in any way as limiting the present invention.

Example 1

(1) Manufacture of Polarizer

A polyvinyl alcohol film (VF-TS #4500, thickness: 45 μm, Kuraray Co., Ltd.) washed with water at 25° C. was subjected to swelling treatment with water at 30° C. in a swelling bath.

After swelling treatment, the polyvinyl alcohol film was dipped in a dyeing bath, which contains an aqueous solution containing 1 mol/ml of potassium iodide and 1 wt % of boric acid, at 30° C. for 65 seconds. After dyeing treatment, the film was uniaxially stretched to 5.7 times in a wet stretching bath containing a 3 wt % aqueous solution of boric acid at 60° C. in the MD of the film. The stretched film was treated in a crosslinking bath containing a 3 wt % aqueous solution of boric acid at 25° C. for 65 seconds while uniaxially stretching the film in the MD.

After crosslinking treatment, the film was dipped in a color correction bath containing a 4.5 wt % aqueous solution of potassium iodide at 30° C. for 10 seconds while uniaxially stretching the film in the MD. After color correction, the film was washed with water and dried by hot air at 80° C. for 1 minute, thereby preparing a polarizer (thickness: 17 μm).

(2) Manufacture of Polarizing Plate

A photocurable bonding agent was applied to both surfaces of the prepared polarizer. A polarizing plate was manufactured by bonding a first protective film (LRB2-80PET) to an upper surface of the polarizer and bonding two sheets of second protective films (laminate of QLAA228 (HWP) and QLAB228 (QWP)) to a lower surface thereof. The first protective film had an internal haze of 4%, an external haze of 41%, and an overall haze of 45%.

Example 2

A polarizer was prepared in the same manner as in Example 1 except that the MD uniaxial stretching ratio was changed in the wet stretching, crosslinking, and color correction baths. A polarizing plate was prepared in the same manner as in Example 1 except that the prepared polarizer was used and a retardation layer (ZA-QWP, a non-liquid crystalline cellulose ester coating layer formed on a COP film) was used as a second protective film.

Example 3

A polarizer was prepared in the same manner as in Example 1 except that the MD uniaxial stretching ratio was changed in the wet stretching, crosslinking, and color correction baths. A polarizing plate was prepared in the same manner as in Example 1 except that the prepared polarizer was used and a retardation layer (ZA-QWP) was used as a second protective film.

Comparative Examples 1 to 4

Polarizers were prepared in the same manner as in Example 2 except that the MD uniaxial stretching ratio was changed in the wet stretching, crosslinking, and color correction baths, and polarizing plates were prepared in the same manner as in Example 2 using the prepared polarizers.

The polarizing plates of the Examples and Comparative Examples were evaluated as to properties listed in Table 1. Results are shown in Table 1 and FIG. 2.

(1) Crossed transmittance of polarizing plate (Tc, unit: %): With the polarizing plate of each of the Examples and Comparative Examples placed in a transmittance meter V-7100 (JASCO Co., Ltd.), crossed transmittances at wavelengths of 430 nm, 550 nm, and 700 nm were measured by transmitting light from the first protective film side to the polarizer in the normal direction to the in-plane direction of the polarizing plate. Light transmittance ratios of Equations 1, 2, and 3 were calculated based on the measured crossed light transmittances.

(2) Color values x, y, and color value difference between front and lateral sides: The polarizing plate manufactured in each of the Examples and Comparative Examples was stacked on an organic light emitting device panel to fabricate a model. Using an EZ-Contrast XL-88, the color coordinates x and y were obtained at a front side (0°, 0°) and a lateral side (60°, 0°). A distance between the front side (0°, 0°) and the lateral (60°, 0°) was calculated as Δ(x, y). Δ(x, y) less than or equal to 0.005 indicates a small color value difference between the front and lateral sides and means that it is difficult to perceive unevenness of the color values between the front and lateral sides with the naked eye, thereby providing good screen quality between the front and lateral sides.

(3) Matte texture: The same model as in (2) was assembled. It was evaluated with the naked eye whether a picture or a photograph was clearly visible and was reproduced to have an original texture (matte texture) of the picture or the photograph such that the picture or the photograph appeared to be part of the screen instead of floating above the screen, upon operation of the model to display the picture or the photograph. Reproduction of an original texture of an oil painting or photograph was rated as good, and failure in reproduction of the original texture of the oil paint or photograph by displaying an unclear oil paint or photograph was rated as poor.

TABLE 1

| | Polarizing plate Tc | | | | | | | | | | Color value | |
|---|---|---|---|---|---|---|---|---|---|---|---|---|
| | @430 nm | @550 nm | @700 nm | Eq. 1 | Eq. 2 | Eq. 3 | Front x | Front y | Lateral x | Lateral y | difference (Δ(x, y)) | Matte texture |
| Example 1 | 0.0072 | 0.0022 | 0.059 | 3.27 | 26.82 | 0.131 | 0.3092 | 0.3121 | 0.3089 | 0.3139 | 0.002 | Good |
| Example 2 | 0.0071 | 0.0021 | 0.059 | 3.38 | 28.10 | 0.131 | 0.3097 | 0.3122 | 0.3090 | 0.3119 | 0.001 | Good |
| Example 3 | 0.0082 | 0.0022 | 0.045 | 3.73 | 20.45 | 0.100 | 0.3098 | 0.3127 | 0.3074 | 0.3127 | 0.002 | Good |
| Comparative Example 1 | 0.0180 | 0.0023 | 0.0307 | 7.83 | 13.35 | 0.068 | 0.3110 | 0.3131 | 0.3191 | 0.3217 | 0.012 | Good |
| Comparative Example 2 | 0.0220 | 0.0022 | 0.0294 | 10.00 | 13.36 | 0.065 | 0.3112 | 0.3138 | 0.3192 | 0.3229 | 0.012 | Good |
| Comparative Example 3 | 0.0084 | 0.0027 | 0.051 | 3.11 | 18.89 | 0.113 | 0.3109 | 0.3125 | 0.3199 | 0.3187 | 0.011 | Good |
| Comparative Example 4 | 0.0130 | 0.0031 | 0.081 | 4.19 | 26.13 | 0.180 | 0.3099 | 0.3129 | 0.3115 | 0.3225 | 0.010 | Good |

As shown in Table 1, the polarizing plate including the first protective film according to embodiments of the present invention realizes matte texture of a picture or a photograph on the screen of the optical display apparatus when the optical display apparatus is not operated. Further, the polarizing plate according to embodiments of the present invention satisfies the ratios of Equations 1 and 2, thereby reducing a color value difference on the screen between the front and lateral sides when the optical display apparatus is operated.

By contrast, as shown in Table 1, the polarizing plates of the Comparative Examples failing to satisfy the ratios of Equations 1 and 2 exhibited a significant color value difference between the front and lateral sides, and allowed easy recognition of unevenness of the color values between the front and lateral sides.

Figure 2:
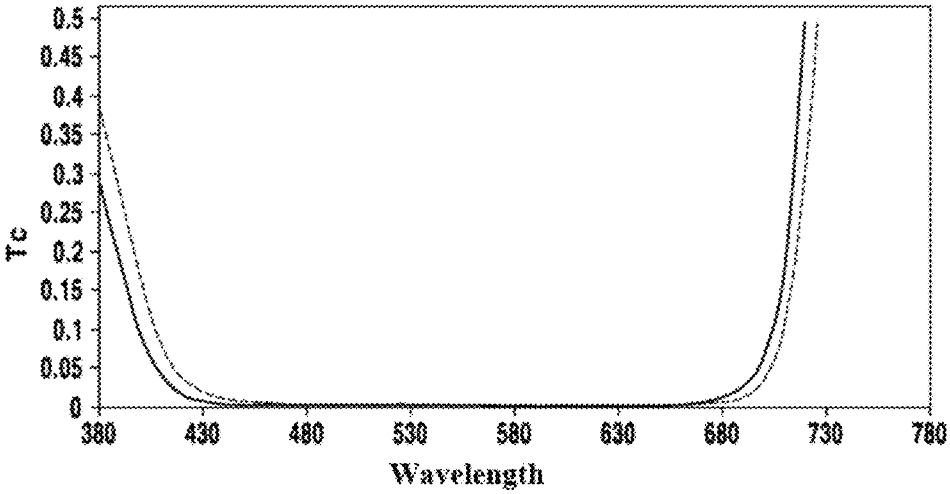
FIG. 2 is a graph depicting a relationship between crossed transmittance (Tc) (Y-axis, unit: %) of a polarizing plate and wavelength (X-axis, unit: nm) in an Example 1 (solid line) and a Comparative Example 1 (dotted line).

Further, as shown in FIG. 2, it can be seen that the polarizing plate of Example 1 had a lower crossed transmittance at a wavelength of 430 nm and a higher crossed transmittance at a wavelength of 700 nm than the polarizing plate of Comparative Example 1, thereby providing different crossed transmittances at wavelengths of 430 nm and 700 nm. This result means that, even with the same first protective film, the crossed transmittance of the polarizing plate needs to be adjusted to provide the effects of the present invention.

While some example embodiments have been described herein, it is to be understood that various modifications, changes, alterations, and equivalent embodiments can be made by those skilled in the art without departing from the spirit and scope of the present invention.

What is claimed is:

1. A polarizing plate comprising:

a polarizer; and a first protective film stacked on a surface of the polarizer, wherein the first protective film has an overall haze of 40% to 60% and an internal haze of 3% to 7%, and wherein the polarizing plate has a light transmittance ratio of 4 or less, as calculated according to the following Equation 1, and a light transmittance ratio of 20 or more, as calculated according to the following Equation 2:

$$\text{Light transmittance ratio} = Tc\ (430\ \text{nm})/Tc\ (550\ \text{nm}), \quad (1)$$

$$\text{Light transmittance ratio} = Tc\ (700\ \text{nm})/Tc\ (550\ \text{nm}), \quad (2)$$

where

Tc (430 nm) denotes a crossed transmittance of the polarizing plate at a wavelength of 430 nm (unit: %), Tc (550 nm) denotes a crossed transmittance of the polarizing plate at a wavelength of 550 nm (unit: %), and Tc (700 nm) denotes a crossed transmittance of the polarizing plate at a wavelength of 700 nm (unit: %).

2. The polarizing plate as claimed in claim 1, wherein the crossed transmittance of the polarizing plate at a wavelength of 430 nm is 0.009% or less.

3. The polarizing plate as claimed in claim 1, wherein the crossed transmittance of the polarizing plate at a wavelength of 550 nm is 0.005% or less.

4. The polarizing plate as claimed in claim 1, wherein the crossed transmittance of the polarizing plate at a wavelength of 700 nm is at least 0.035%.

5. The polarizing plate as claimed in claim 1, wherein the first protective film has a ratio of external haze to internal haze in a range of 9 to 20.

6. The polarizing plate as claimed in claim 1, wherein the first protective film comprises a base layer and an antiglare layer stacked on a surface of the base layer.

7. The polarizing plate as claimed in claim 6, further comprising an antireflection layer stacked on a surface of the antiglare layer.

8. The polarizing plate as claimed in claim 1, wherein the polarizing plate has a ratio of 0.25 or less, as calculated according to the following Equation 3:

$$\text{Ratio} = Tc\ (700\ \text{nm})/(\text{Haze} \times 0.01), \tag{3}$$

where Haze denotes overall haze of the first protective film (unit: %), and

Tc (700 nm) denotes the crossed transmittance of the polarizing plate at a wavelength of 700 nm (unit: %).

9. The polarizing plate as claimed in claim 1, further comprising a second protective film stacked on another surface of the polarizer.

10. The polarizing plate as claimed in claim 9, wherein the second protective film is a retardation film.

11. An optical display apparatus comprising the polarizing plate as claimed in claim 1.

* * * * *